(12) United States Patent
Zutavern et al.

(10) Patent No.: US 6,504,859 B1
(45) Date of Patent: Jan. 7, 2003

(54) LIGHT SOURCES BASED ON SEMICONDUCTOR CURRENT FILAMENTS

(75) Inventors: Fred J. Zutavern, Albuquerque, NM (US); Guillermo M. Loubriel, Albuquerque, NM (US); Malcolm T. Buttram, Sandia Park, NM (US); Alan Mar, Albuquerque, NM (US); Wesley D. Helgeson, Albuquerque, NM (US); Martin W. O'Malley, Edgewood, NM (US); Harold P. Hjalmarson, Albuquerque, NM (US); Albert G. Baca, Albuquerque, NM (US); Weng W. Chow, Cedar Crest, NM (US); G. Allen Vawter, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/489,243

(22) Filed: Jan. 21, 2000

(51) Int. Cl.$^7$ ................................................. H01S 5/00
(52) U.S. Cl. ........................................................ 372/44
(58) Field of Search ............................. 372/44, 45, 46, 372/50

(56) References Cited

U.S. PATENT DOCUMENTS

| | | | |
|---|---|---|---|
| 4,350,960 A | 9/1982 | Matthews et al. | 372/46 |
| 4,631,729 A | 12/1986 | Goodwin et al. | 372/44 |
| 4,633,477 A | 12/1986 | Morrison et al. | 372/46 |
| 4,730,326 A | 3/1988 | Taneya et al. | 372/44 |
| 4,791,651 A | 12/1988 | Taneya et al. | 372/50 |
| 4,870,651 A | 9/1989 | Taneya et al. | 372/50 |
| 4,891,815 A | 1/1990 | Ragle et al. | 372/44 |

OTHER PUBLICATIONS

Bogdankevich, *Electron–beam—pumped semiconductor lasers*, Quantum Electronics 24 (12), 1031–1050 (1990), (No month).

*High–power Optically Activated Solid–State Switches*, Rosen and Zutavern editors, Artech House (1994), (No month) pp 245–297 (Incorporated herein by reference).

Williams, "*Gallium Arsenide Processing Techniques*", Artech House, Dedham, MA (1984), (Only the Table of Contents and the First page of Chapters 4,5,6,7,8–17).

Agrawal, et al, "*Long wavelength Semiconductor Lasers*", Van Nostrand Reinhold, NY (1986)(No month) pp 1–22.

Coldren, et al, "*Diode Lasers and Photonic Integrated Circcuits*", John Wiley, NY (1995) (No month) (pp. vii–xv: Table of Contents Only).

*Primary Examiner*—Quyen Leung
(74) *Attorney, Agent, or Firm*—Gerald Grafe; Suzanne L. K. Rountree; Fred A. Lewis

(57) ABSTRACT

The present invention provides a new type of semiconductor light source that can produce a high peak power output and is not injection, e-beam, or optically pumped. The present invention is capable of producing high quality coherent or incoherent optical emission. The present invention is based on current filaments, unlike conventional semiconductor lasers that are based on p-n junctions. The present invention provides a light source formed by an electron-hole plasma inside a current filament. The electron-hole plasma can be several hundred microns in diameter and several centimeters long. A current filament can be initiated optically or with an e-beam, but can be pumped electrically across a large insulating region. A current filament can be produced in high gain photoconductive semiconductor switches. The light source provided by the present invention has a potentially large volume and therefore a potentially large energy per pulse or peak power available from a single (coherent) semiconductor laser. Like other semiconductor lasers, these light sources will emit radiation at the wavelength near the bandgap energy (for GaAs 875 nm or near infra red). Immediate potential applications of the present invention include high energy, short pulse, compact, low cost lasers and other incoherent light sources.

15 Claims, 7 Drawing Sheets

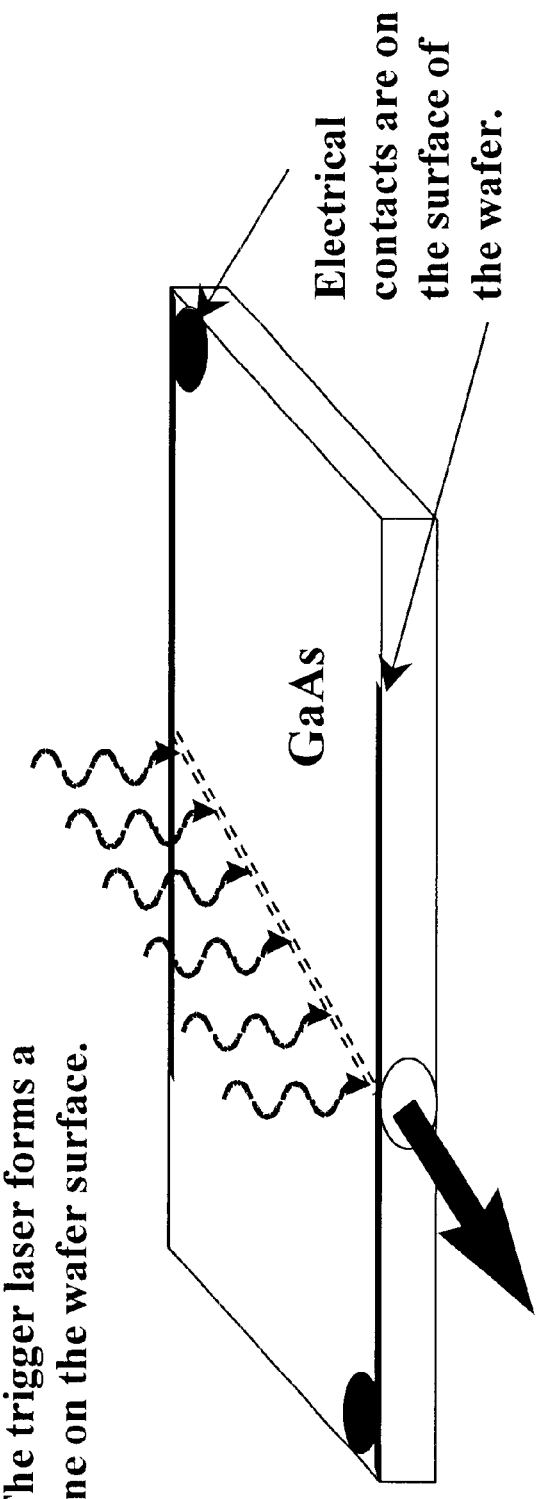

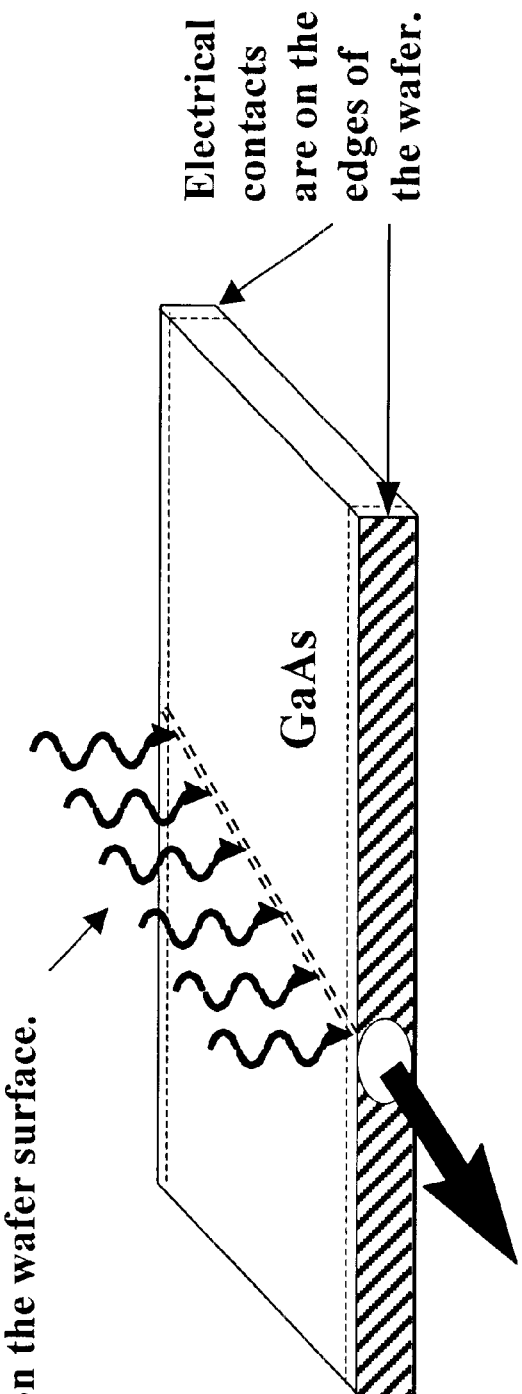

A line of light triggers a straight line current filament in a high gain GaAs PCSS. The laser is formed between the edges of the chip in the plasma of the current filament.

0.5 mm Quasi-vertical Device

LIGHT SOURCES BASED ON SEMICONDUCTOR CURRENT FILAMENTS

This invention was made with Government support under Contract DE-AC04-94AL85000 awarded by the U.S. Department of Energy. The Government has certain rights in the invention.

BACKGROUND OF THE INVENTION

This invention relates to the field of semiconductor light sources, specifically light sources that produce incoherent and coherent optical emission (lasers) using current filaments in semiconductors as the source of the optical emission.

Miniature short pulse lasers are used in various applications including: active optical sensing and imaging in clear and limited visibility environments; fiber optic isolation and communication; scientific exploration involving optical excitation and probing techniques; optical reading and writing of digital information for computer access; direct and indirect optical ignition of fuels and explosives; medical procedures to illuminate, heat, burn, or ablate tissue; and micro-machining micron-size features patterned over large areas of metals and alloys. These applications generally require short pulses and low beam divergence. Conventional semiconductor lasers are unsuitable for many of these applications because they do not deliver sufficient high beam quality optical energy.

Conventional semiconductor lasers can be placed in three general categories: injection-pumped, optically-pumped, and electron-beam-pumped. A conventional injection-pumped or diode laser is pumped with carriers injected across a diode junction. There are many types of injection lasers: single & double heterojunction, quantum well, and vertical cavity surface emitting (VCSEL), for example. See, e.g., Matthews et al., U.S. Pat. No. 4,350,960 (1982); Goodwin et al., U.S. Pat. No. 4,631,729 (1986); Morrison et al., U.S. Pat. No. 4,633,477 (1986); Taneya et al., U.S. Pat. No. 4,730,326 (1988); Taneya et al., U.S. Pat. No. 4,791,651 (1988); Taneya et al., U.S. Pat. No. 4,870,651 (1989). All of these lasers are made with n-type and p-type regions which form junctions. They are limited in one dimension to the effective length of a junction, which is typically 1–2 microns. Injection-pumped lasers make up most of the commercial semiconductor lasers available today. They are very efficient and can be fabricated monolithically in large arrays. However, most arrays are not spatially coherent and therefore not as useful for many applications as a single large laser with the same total energy per pulse or peak power. Flared waveguide lasers and master oscillator power amplifiers are other examples of large area single-element injection lasers, that have coherent, diffraction-limited, output beams.

A second type of semiconductor laser is one which is pumped optically. New types of materials or lasing configurations are often tested first by pumping the device optically instead of injecting current. Electrical contacts are not necessary, so this technique is very useful in diagnosing new structures. However optical pumping can require another laser to do the pumping, which makes it not very efficient. This type of laser can be much larger, but when an optically pumped laser is the goal, materials other than semiconductors are generally used as the lasing medium. These are known as "solid state" lasers, such as Nd:YAG or Ti:Al2O3 (Titanium-Saphire). These materials can store the energy longer in a different lasing scheme than semiconductors.

A third type of semiconductor laser is pumped with a high energy electron beam. See Bogdankevich, "Electron-beam-pumped semiconductor lasers", Quantum Electronics 24(12) 1031–1050 (1994). The electrons excite many "hot" carriers across the semiconductor band gap as they are absorbed. These carriers cool rapidly to form the population inversion characteristic of lasing. The major disadvantage for this type of laser is that it requires an electron beam, and is consequently expensive and difficult to mass produce. They have been used to make a high brightness replacement for a cathode ray (television) tube. Many types of semiconductors have been tested for this type of lasing, but their development has not been pursued outside of Russia.

Ragle et al., U.S. Pat. No. 4,891,815 (1990), proposed a laser that would be made from high gain GaAs photoconductive switches (PCSS). Ragle was based on the information about GaAs PCSS that was available at the time of the patent: total current and device size. From these, an average carrier density was calculated, assuming uniform carrier distribution through the active region of the device. The patent claimed that a laser could be made from this carrier density if a cavity was built around the device, and proposed several examples of how this might be done. However, more recent experiments have shown that high gain PCSS, which produce sufficient carrier densities to lase, always form current filaments. The carrier density is not uniform, but concentrated in tight filamentary bundles. Furthermore, if the PCSS is triggered with uniform illumination, as proposed in the patent, the filaments form like microscopic lightning bolts in jagged, non-linear streaks across the device which are different each time the device is pulsed. Finally, Ragle proposed to make a laser beam that is perpendicular to the current flow. The intersection of such a cavity with the current filaments would be too small to make a laser. Most of the cavity would consist of strongly absorbing GaAs where there are very few carriers, and the threshold to lasing would not reached. Recent research has shown that these conditions do not produce a laser or reproducible light source.

Accordingly, there is a need for semiconductor light sources that can: (1) produce higher peak power than conventional semiconductor lasers (2) are capable of producing high quality coherent beams; and (3) do not require optical or e-beam pumping.

SUMMARY OF THE INVENTION

The present invention provides a new type of semiconductor light source that can produce a high peak power output and is not injection, e-beam, or optically pumped. The present invention is capable of producing high quality coherent or incoherent optical emission. The present invention is based on current filaments. The current filaments can form with optical stimulation and high electric fields in certain types of semiconductors. As the charge carriers in the filaments recombine, they can emit visible and near-visible radiation. This emission can either be used directly to produce incoherent light sources or, if the filaments are incorporated into an optical cavity that supplies the appropriate optical feedback, amplification of the emission from the filaments will produce coherent optical emission (lasers).

The present invention provides a light source formed by the electron-hole plasma inside a current filament. The electron-hole plasma can be several hundred microns in diameter and several centimeters long. A current filament can be initiated optically, with an e-beam, or self-triggered, and is pumped by the electric field across a large insulating region. A current filament can be produced in high gain photoconductive semiconductor switches described in "High-power Optically Activated Solid-State Switches", Rosen and Zutavem editors, Artech house (1994), incorporated herein by reference. The new type of light source provided by the present invention has a potentially large volume and therefore a potentially large energy per pulse or peak power available as a single (coherent) semiconductor laser. Like other semiconductor light sources, these light sources will emit radiation at the wavelength corresponding to the bandgap energy (for GaAs 875 nm or near infra red). Immediate potential applications of the present invention include high energy, short pulse, compact, low cost light sources.

A light source according to the present invention comprises a bulk insulating direct bandgap semiconductor substrate and electrical contacts. An electric source is connected across two contacts on the device to produce an electric field in the substrate. An initiator, for example a source of a narrow straight line light beam, impinges on the surface of the substrate and initiates a current filament. Recombination of electron-hole pairs in the current filament causes optical emission. For an incoherent light source, the emission from the filaments can be collected and directed to the field of illumination. For a coherent light source, a laser cavity can be made by reflection of on-axis photons from the ends of the substrate which stimulates additional recombination and emission and can produce a narrow frequency band, coherent beam of light.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides a new type of semiconductor light source that can produce a high peak power output and is not injection, e-beam, or optically pumped. The present invention is capable of producing high quality coherent or incoherent optical emission. The present invention is based on current filaments.

Figure 1:
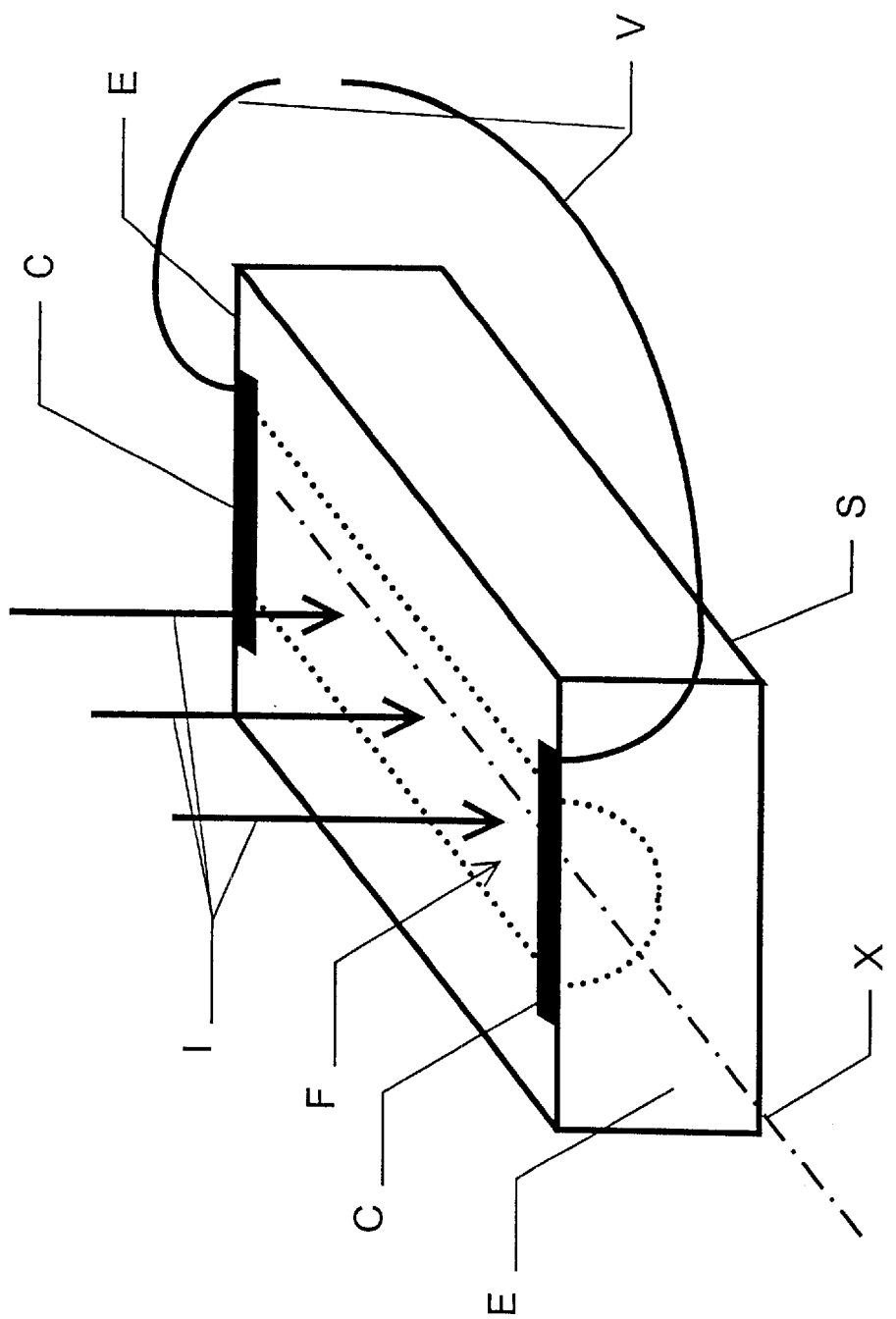
FIG. 1 is a schematic view of a semiconductor current filament laser according to the present invention.

FIG. 1 is a schematic view of a semiconductor current filament light source according to the present invention. Bulk semiconductor substrate S has first and second ends E. Electrical contacts C mount with substrate S near ends E. Electrical source V connects to contacts C. Electrical source V imposes an electric field between ends E and across substrate S. Initiator I directs energy onto substrate S to initiate conduction. Initiator I can direct light onto substrate S, generating a substantially straight axis X for a current filament F. Alternatively, initiator I can be an e-beam, or can be sufficient electrical energy from electrical source V to cause the filament to self-trigger.

In operation, electric field from electric source V provides energy to create avalanche carrier generation. Energy from initiator I generates "seed" carriers within substrate S. These "seed" carriers gain energy from the electric field. They scatter off the lattice and other carriers and heat the carrier distribution to the point that some new valence electrons get excited by the electric field across the band gap, creating new conduction electrons and holes. These new conduction electrons and holes add to the population that is being heated by the field, and avalanche growth ensues until the field (which can be current limited by the external circuit) drops to a so-called "lock-on" field.

Current filament F substantially follows the line of initiation, since that is where the "seed" carriers initiate conduction. In substrate S, electrons and holes constantly recombine with a probability that manifests in an exponential recombination lifetime. For a GaAs substrate the lifetime can be about 10–20 ns. As electrons and holes recombine, the resistance of the filament increases, so the voltage across the switch increases (assuming a current limited external circuit), and hence the electric field increases. This causes carriers to be generated at a higher rate and a quasi-steady-state condition develops. "Quasi" because the carriers are gradually heating the lattice changing the properties of the semiconductor.

Direct bandgap recombination of electron-hole pairs along current filament F produces optical emission, with greater than 95% efficiency in GaAs substrates. Generated photons with trajectories off axis X are reabsorbed by substrate S or travel out of the path of filament F. Generated photons with trajectories along axis X have opportunity to stimulate recombination of other electron-hole pairs, thus stimulating the emission of other photons which can continue to stimulate the growth along the axis. Light energy from on-axis photons can be partially reflected from ends E back into substrate S, stimulating more electron-hole recombination and on-axis photons. Light energy transmitted through ends E is available external to device D as laser light.

Substrate

Substrate S can be made of materials such as direct bandgap semiconductors. For example, direct bandgap semiconductors such GaAs, InP, GaSb, GaN, InSb, InN, CdS, CdSe, CdTe, ZnO, ZnS, AlGaAs, InGaAlP, AlGaN, InGaAs, GaAsSb, InAsP, AlGaInP, AlN, ZnSe, ZnSSe, SN, InAs, GaAsP, GaAlAs, CdSSe, ZnCdSe, InAsAb, PbSSe, PbSe, PbTe, PbS, ZnTe, PbSnTe, PbSnSe, CdSi, MgSe, MgS, MnSe, MnTe, HgTe, ZnMgSSe, CdHgTe, and BiSb can be suitable. Processing techniques for direct bandgap semiconductors are known to those skilled in the art.

A current filament laser according to the present invention can operate with a wide range of current filament lengths. Devices with filament lengths ranging from 100 microns to 3.4 cm have been tested.

Contacts

Contacts C define the ends of current filament F, and thus define the ends of region of substrate S where significant optical emission occurs. Accordingly, contacts C can be near the ends of the substrate. Contacts C can be made in various shapes and from various materials. For example, contacts C can be deposited on the surface of substrate S using conventional semiconductor processing techniques. Current filament F will then have to "bend up" out of the optical path to reach contacts C; FIG. 2a. Alternatively, contacts C can be mounted with ends E directly in the optical path, reducing "bending" or "pinching" of current filament F; FIGS. 2(b,c). Degradation of contacts C mounted in the optical path can adversely affect optical properties, however. Substrate S can be doped and made conductive near contacts C to reduce filament "pinching" and to help protect contacts C against damage from high filament currents. Contacts C can be mounted with substrate S in various ways known to those skilled in the art, including by ion implantation, deep diffusion, and epitaxial growth. See, e.g., Williams, "Modern GaAs Processing Methods", ARTECH House, Norwood Mass. (1990).

Electrical Source

Electrical source V must be able to impose sufficient electric field strength to drive avalanche carrier generation. Electrical source V must also be able to supply current suitable for creation and maintenance of current filament F. Specific electrical field strength and current requirements can depend on characteristics of substrate S, desired device D lifetime, and desired device D performance. For example, with substrate S made from nearly intrinsic undoped GaAs, with a resistivity greater than 10,000,000 Ohm cm, an electric field greater than 10 kV/cm can support initiation of a current filament. Once the filament forms, an electric field of about 5 to 6 kV/cm can sustain the filament. The current can be limited by an external source to maintain a suitable electric field strength. Currents from 2 A to 8,000 A have been tested and proven suitable. Lasing has been demonstrated at currents from about 8 A to about 120 A. Very high currents, however, can make it difficult to distinguish between very large, nonuniform current filaments and multiple current filaments. This poses no problems for incoherent light sources, but can make more difficult production of a stable monochromatic lasing cavity.

Initiation

Initiator I can comprise any mechanism that creates carriers, photons, or charged particles in substrate S. A stripe of light or an e-beam impinging on substrate S along the desired path of the current filament can initiate a straight line current filament. For example, a 40 micron wide line of light across a 2.5 mm gap between electrical contacts can be suitable. As another example, a plurality of spots of light impinging on substrate S along a substantially straight line can initiate a straight line current filament. Initiator I must supply sufficient energy to initiate a current filament. With undoped GaAs substrates and about 10 kV/cm electric field and about 50 to 100 nJ delivered to the substrate in about 10 ns can be sufficient initiation. As another example, near band-gap radiation can initiate filaments that are coaxial with the initiating beam. These filaments will be aligned with the initiating beam, offering improved beam control. As another example, leakage current in the device can cause initiation. Allowing a sufficient electric field to persist across the desired path can trigger a current filament using leakage current alone ("self-triggering").

Lasing

On-axis photons can reflect from ends E back into substrate S. On-axis photons can then stimulate carrier-hole recombination, generating additional photons with the same phase and frequency as the reflected photon. The total of stimulated on-axis photons can produce a coherent monochromatic light beam. Non-uniformities in the electron-hole plasma can lead to spectral line broadening.

EXAMPLES

Figure 2C:
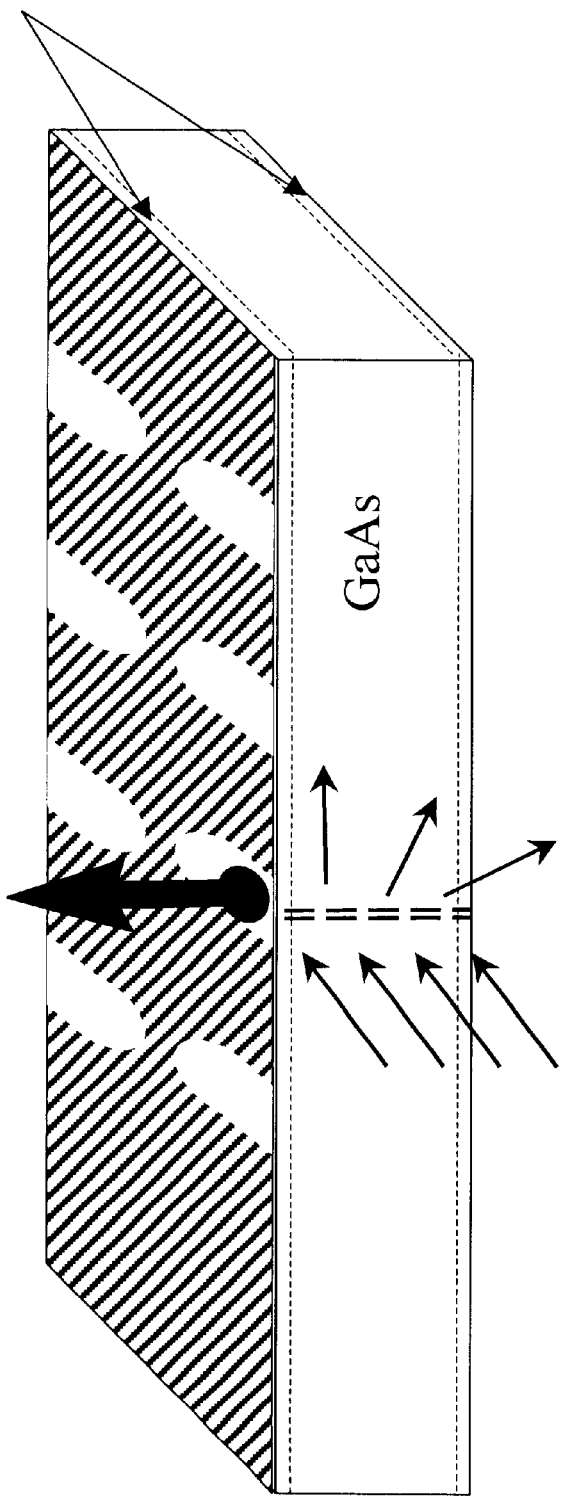
FIGS. 2(a,b,c) are diagrams of three semiconductor current filament lasers according to the present invention.

Structures for SCFLs that have 0.5, 1.0, and 2.5 mm long gaps (cavities) have been produced; the diameter of the cavity is essentially the diameter of the filament which ranges from 50–200 microns. SCFLs have been tested by triggering them and recording their optical emission and electrical properties. We have recorded optical output of 75 nJ which implied a total of more than 150 nJ out of a single laser operating at about 30 A. In some tests, the optical pulse width is less than 1 ns and the optical wavelength linewidth is less than 0.08 nm. Devices with transparent edge contacts can make better filaments for lasing, but can be difficult to fabricate; FIG. 2b. Vertical cavity SCFLs can have better contacts and can be easier to fabricate and mass produce; FIG. 2c. With the vertical cavity SCFL, the trigger light can still enter from a surface parallel to the current filament, but the contacts at the ends of the cavity are fabricated on the opposing surfaces of the wafer before it is cut into devices. Dimensions can range from 0.5 mm to 5 mm long with enough area to make facilitate handling and testing. The examples below include devices we have built and tested as well as other approaches to implementing the present invention.

A further extension of the vertical-cavity SCFL is to include relatively wide-bandgap material, such as AlGaAs in the case of a GaAs SCFL, at the upper and lower mirror surfaces. These wide-gap mirrors will be transparent at the lasing and trigger wavelengths. The benefits of transparent material at the mirror surface are two-fold: 1) Optical self absorption at the mirror will be reduced or eliminated resulting in higher maximum output power density prior to catastrophic optical damage (COD) of the laser facet; 2) On-axis triggering becomes more practical with improved penetration of the trigger light into the laser cavity and, possibly, reduced trigger energy. The use of on-axis triggering using wavelengths with low (but non-zero) absorption so that the trigger beam is absorbed over a significant portion of the laser length will result in more stable filament formation and possibly even "self-aligned" laser emission along the axis of the trigger beam. Such stable self-alignment of the laser emission will enable a wide-variety of applications where well-controlled far-field emission is required.

Confining carriers and photons can produce a more stable and more efficient optical cavity. Conventional confinement techniques suitable for adaptation to the present invention are summarized below.

|  | Optical confinement | Electrical confinement |
| --- | --- | --- |
| Vertical | Epitaxial growth. | Epitaxial growth. |
| Horizontal | Etch and regrowth of trenches and ribs; oxidation; diffusion disordering. | Etch and regrowth of trenches and ribs; insulating implant; oxidation; diffusion disordering. |

The techniques listed above can improve laser stability by confinement of either the charge carriers or the photons in the active region of the device. Confinement produces higher and more uniform carrier or photon densities. A simple example of confinement is to produce an etched-rib cavity on the surface of a GaAs substrate, so that the physical boundary of the semiconductor confines the electrons and the high refractive index of GaAs confines the photons. Another example is the use of epitaxial growth to produce indirect band-gap material which will not support filament formation and low refractive index material at the boundaries of the active region. This confines the filament, which is where the charge carriers are created, and also produces an index-guided cavity. Confinement techniques applied to conventional semiconductor lasers are known in the art. See, e.g., Agrawal et al., Long wavelength Semiconductor Lasers, Van Nostrand Reinhold, NY (1986); Coldren et al., Diode Lasers and Photonic Integrated Circuits, John Wiley, NY (1995).

Fabrication

We have fabricated SCFLs that fit into three general categories: (a) lateral current with surface contacts; (b) lateral current with edge contacts; and (c) vertical current with surface contacts and edge illumination. FIGS. 2(a,b,c) contains diagrams of these three categories of SCFLs. The devices have been made from high resistivity GaAs, although they can be made from any direct band-gap semiconductor that supports high gain photo-conductive semiconductor switching (PCSS), for example InP. There are several ways of obtaining high resistance GaAs, including semi-insulating, liquid-encapsulating, chrome doping, vertical gradient growing, and EL2(defect)-compensating.

SCFLs have three configuration characteristics: (1) electrical contacts, (2) optical or e-beam triggering, and (3) optical output coupling. The devices in FIGS. 2(a,b,c) have two metallic electrical contacts which are used to produce a high field in the high resistivity semiconductor between the contacts. The devices can be illuminated by an optical or e-beam trigger which initiates a current filament between the contacts. Filaments can be triggered with uniform illumination, spot or point illumination, co-axial illumination, or line illumination at any position in the high field region. Strong absorption of the illumination reduces the optical power required to initiate the filament. Very strong absorption causes the filament to form too close to the surface. This can make it harder to trigger (due to surface defects and dangling bonds) and potentially leads to increased surface degradation. These effects imply a desirable wavelength of trigger light that is close to the band-gap energy for the material, for example, 875 nm for GaAs. Once a filament is initiated, it can be coupled to the surfaces of the device for optical feedback and output coupling. If the surfaces are used as mirrors, then they must be approximately parallel, by cleaving or polishing. For reflectivity other than the intrinsic value of about 30%, a metal or dielectric coating can be used. If external mirrors are required, anti-reflecting coatings can be used to eliminate internal reflections.

The SCFL device of FIG. 2a is characterized by lateral current with surface contacts. This SCFL configuration can be easy to fabricate, and can have crystal plane mirrors formed at cleaved edges. Contacts and a passivation layer over the high field gap between the contacts can be formed on the same surface. Monolithic processing can be applied to all devices on a single surface of the substrate. Thinned substrates can be cleaved accurately with present processing technology, and the cleaves can pass within a few microns of the contact edges (allowing a current filament to extend almost the full length of the cavity). The SCFL configuration in FIG. 2a, however, can exhibit a "dead" space in the cavity below the contacts near the cleaved surfaces. These regions are shadowed by the contacts so no carriers are created by the optical trigger. The electric field curves up to the surface edges of the metallic contacts, so filaments might not exist below the contacts. Thus a strongly absorbing, high resistance region can exist under each contact in the cavity "line-of-sight" between the mirrors formed by cleaved edges. These regions can act like Q-switches, since their absorption could be saturated. However, the inhomogeneities in carrier density near the ends of the filaments as they curve to the surface can also induce mixed-mode lasing and unstable operation. The SCFL configurations of FIGS. 2(b,c) can induce straight filament formation through the entire cavity with no "dead" regions.

The SCFL configuration shown in FIG. 2b has contacts fabricated in the edges of a cleaved substrate. This configuration can be desirable for the optical cavity. Processing substrate edges, however, can be extremely difficult with present processing technology. The wafer must first be cleaved into "slices" that can be stacked so that the edges can be processed. After processing one set of edges, the devices must be turned over to process the other edges. Edge contacts can be formed by ion-implantation and metal coating, for example, but current processing limitations make device fabrication difficult.

The SCFL configuration shown in FIG. 2c can be much easier to fabricate with present processing technology. Fabrication of a SCFL according to FIG. 2c involves contact and mirror/coating fabrication on polished surfaces of the substrate before it is cleaved into devices. Epitaxial growth, wide-gap transparent facets for damage resistance and trigger depth, dielectric, and metal coatings can be readily patterned onto these surfaces. Proper alignment of the patterning on the opposing surfaces can be important. A challenge in fabrication of this configuration is obtaining the required parallelism and reflectivity of the polished surfaces. Both surfaces should be highly polished and "epi-ready" to produce desirable mirrors for the lasing cavity. The cavity length of the configuration of FIG. 2c is limited to the thickness of the substrate. GaAs substrates are currently available in thicknesses ranging from 0.5 to 5 mm. Thicker material can be difficult to cleave, and can require saw cutting. Conventional semiconductor lasers are typically shorter that 0.5 mm; currently available GaAs substrates can provide lasing cavities of comparable lengths.

Testing

The technical challenges associated with testing these devices can be divided into three areas: pulse charging the device to create an electric field where the filaments will form, optical or e-beam trigger delivery to initiate the formation of straight line filaments, and diagnostics to determine the electrical and optical operating properties of the device.

Figure 3:
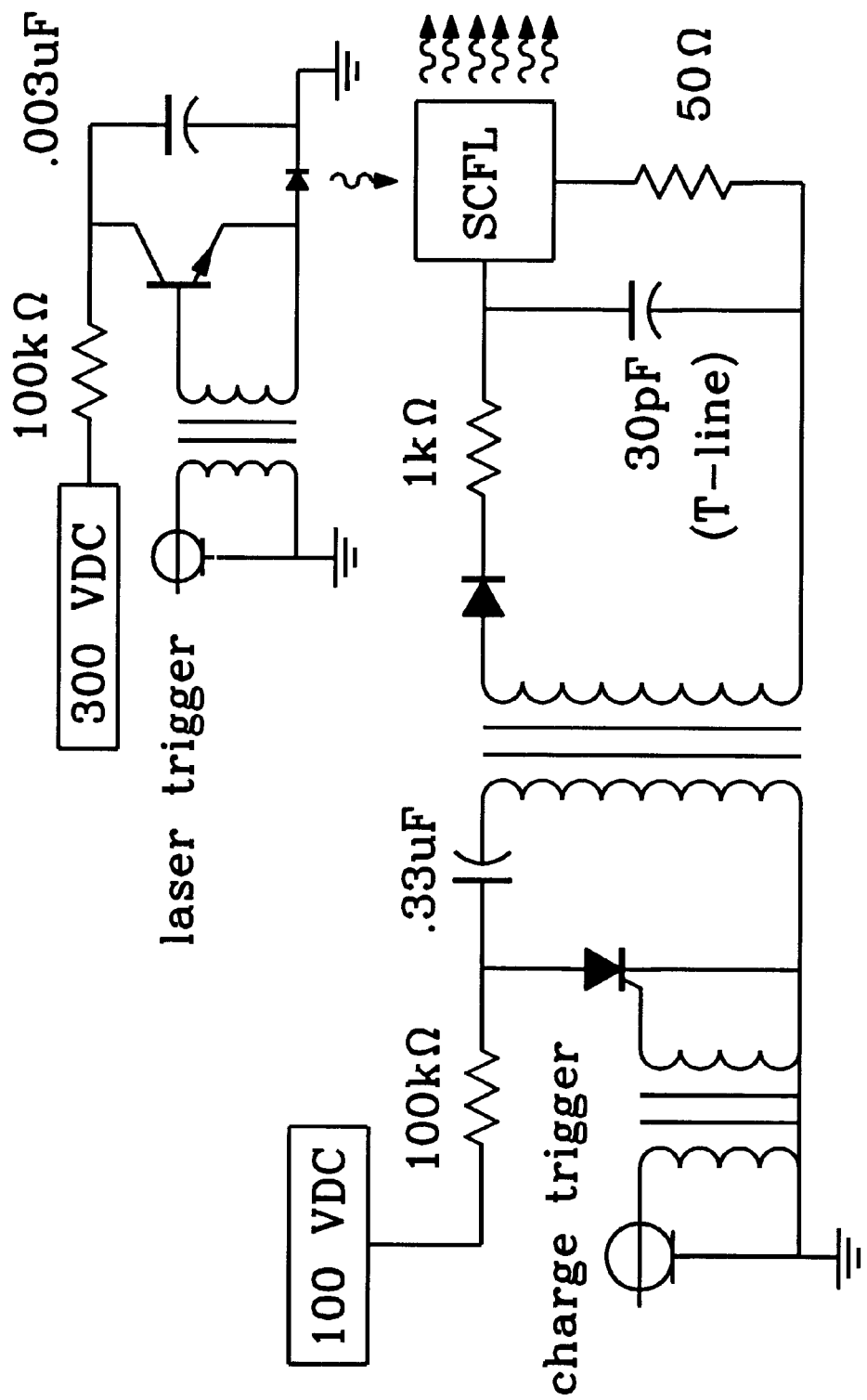
FIG. 3 is a schematic diagram of a pulse charging circuit which produce an electric field in the device.

The first technical challenges with SCFL testing are the electro-magnetic pulse charging and diagnostic requirements. To form filaments in GaAs SCFLs with what dimensions/properties, the contacts can be charged to 20–80 kV/cm. Short pulse charging works with the widest range of devices. Long pulses or DC charging can produce leakage currents which cause self-triggering (i.e. no optical trigger control). Short or more conductive devices can have the most pronounced self-triggering. Reverse biased contacts which form Schottky or other barriers can reduce leakage current and allow long pulse or DC charging without self-triggering. Neutron irradiation of a GaAs substrate can produce a fast recombination, high resistivity material which can be DC charged without self-triggering. A circuit suitable for pulse charging a SCFL is shown in FIG. 3. A pulse transformer and an SCR, FET, or thyratron can be used to produce a high voltage pulse with enough current to charge a high speed test circuit in a few microseconds. The charging voltage can be monitored by a relatively high impedance (low bandwidth) monitor which can follow the charging pulse, but not the high speed test pulse. The high speed circuit can be coupled to the charging circuit with a diode stack, so that the energy in the charging circuit can drop to zero leaving the high speed circuit charged. This avoids a post-pulse re-charge of the high speed circuit which can damage the SCFL as it recovers its high resistance state.

The high speed circuit can simply consist of a pulse forming line (PFL) (transmission line or capacitor) which stores energy until the SCFL is triggered. Upon triggering, the SCFL conductance increases until the field across the SCFL drops, for example to 4–6 kV/cm for various types of GaAs). As long as the circuit maintains this field across the SCFL, it will continue to conduct. A matched system can be formed to transfer the energy from the pulse forming line to a resistive load where it is dissipated. The current dissipated by the load can be monitored with a low resistance current viewing resistor with sufficient bandwidth (about 3 GHz or more). If a high speed voltage monitor is desired, it can be a capacitive (V-dot) monitor at the electrical output or across the resistive load of the SCFL. There can be a 4–6 kV loss across the SCFL, similar to the voltage regulation of a Zener diode. When the energy from the PFL is dissipated, and the field across the SCFL electrical contacts drops below 4–6 kV/cm the resistance of the SCFL returns and the circuit returns to its initial conditions (before pulse charging).

The second technically challenging area associated with testing these devices is the formation and delivery of an optical or e-beam line trigger to initiate straight line filaments. Several approaches have been tested. For example, a wide stripe edge-emitting laser can be imaged on the device. The source of this illumination has a cross section of a few microns by several hundred microns, so it can be magnified or reduced to form an image on the surface of the device substrate which crosses the active region with a very narrow line of light. If the wide-stripe, edge emitting laser is pulsed with a high voltage, low-impedance electrical power source, it will produce a short, intense pulse of light which is sufficient to initiate current filaments in the device.

Figure 4:
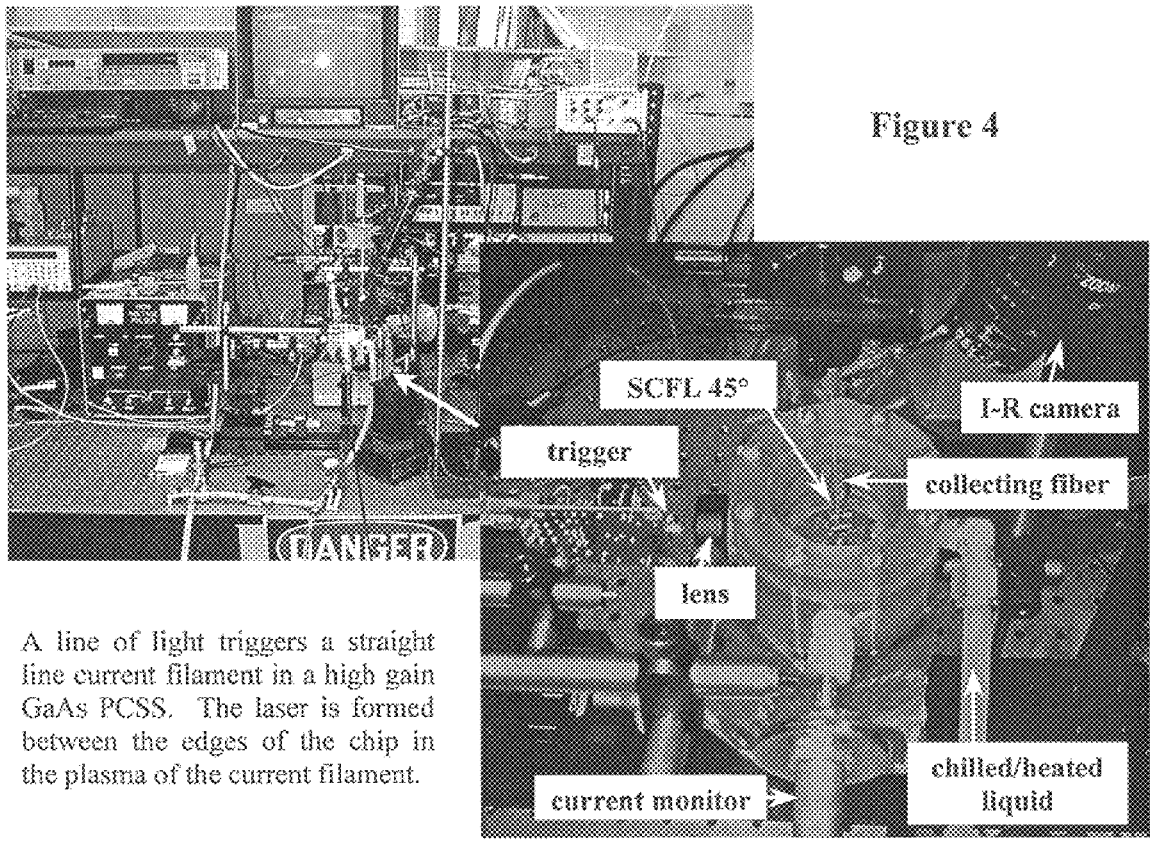
FIG. 4 is a photograph of a device test bed.

The third technically challenging area of device testing, electrical and optical diagnosis, is best described by a photograph. FIGS. 4(a,b) is an image of a test bed used to trigger and test SCFLs. The trigger laser can be pulsed with an avalanche transistor based circuit. It can be imaged onto a SCFL through an aspheric (aberration-corrected) short focal length lens to form a sharp (high intensity) line on the surface of the SCFL. The SCFL can be submerged in a liquid dielectric to suppress surface flashover (due to high electric fields). The optical pulse from one end of the SCFL can be observed with a CCD camera, photo-diode, or spectrometer. Fiber-optic coupling can transport the light to a photo-diode and a spectrometer. The ambient temperature of the SCFL can be regulated by controlling the temperature of the liquid dielectric.

Figure 5:
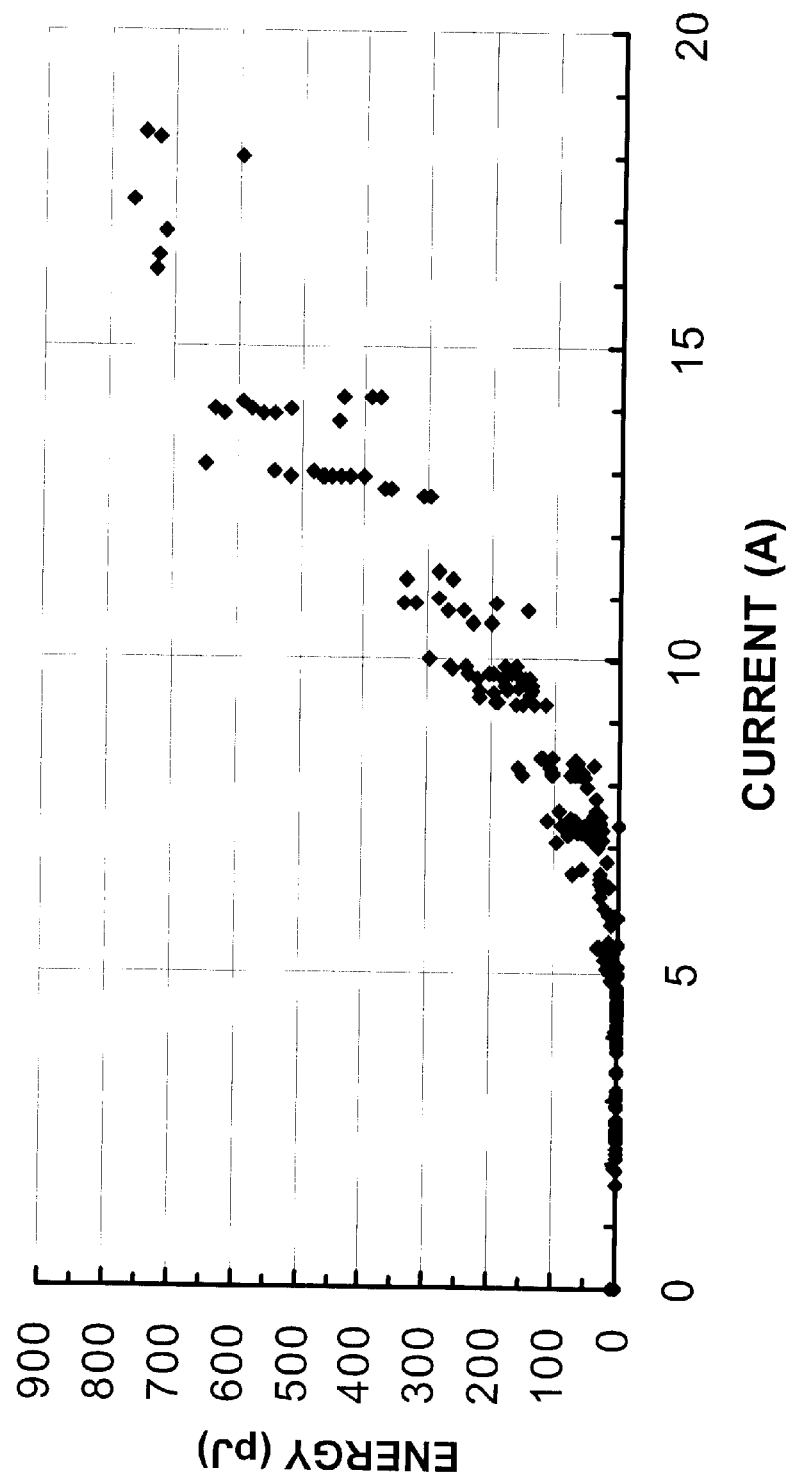
FIG. 5 is a graph showing a characteristic threshold to lasing for a device according to the present invention.

One of the methods to demonstrate lasing is to measure the threshold to optical emission. A device that is emitting incoherent recombination radiation will produce emission that increases linearly from zero with increasing current. A plot of emission versus current will fit a straight line that goes through (0,0). However a laser, that produces coherent emission, has a threshold current which much be reached before lasing is initiated. Above this threshold, the emission will increase rapidly with increasing current, so a plot of optical emission versus current shows a non-zero threshold or a fit to the data with a non-zero intercept on the emission axis. FIG. 5 shows this characteristic threshold to lasing for a device according to the present invention. The current threshold to optical emission for the device of FIG. 5 is approximately 5 A (x-axis intercept). Spontaneous recombination radiation has no threshold (0 x,y-intercept).

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A semiconductor current filament light source, comprising:
   a) A homogenous semiconductor substrate, having first and second opposing ends wherein said first end is at least partly optically transmissive and light is emitted from said first end;
   b) An electric field generator connected across said first and second ends and generating a current flow substantially along the same direction as output light;
   c) A current filament initiator, comprising a light beam illuminating said substrate along a path between said first and second ends.

2. The light source of claim 1, wherein said light source comprises a coherent light source.

3. The light source of claim 2, wherein said first and second ends are at least partially optically reflecting, and wherein the current filament initiator initiates a current filament substantially along an axis between the first and second ends.

4. The light source of claim 1, wherein said semiconductor substrate comprises a direct band gap insulating semiconductor.

5. The light source of claim 1, wherein said semiconductor substrate comprises a material selected from the group consisting of: GaAs, InP, GaSb, GaN, InSb, InN, CdS, CdSe, CdTe, ZnO, ZnS, AlGaAs, InGaAlP, AlGaN, InGaAs, and combinations thereof.

6. The light source of claim 1, wherein said semiconductor substrate further comprises electrical contacts mounted with said substrate near said first and second ends.

7. The light source of claim 6, wherein each electrical contact comprises an electrical connection and a conductive region of said substrate adjacent thereto.

8. The light source of claim 6, wherein said electrical contacts are selected from the group consisting of: ion implanted conductive region of said substrate, deep diffused region of said substrate, epitaxially grown conductive region, evaporated metallization, and combinations thereof.

9. The light source of claim 1, wherein said semiconductor substrate comprises semi-insulating GaAs, and wherein said first and second ends comprise a conductive region of the substrate in electrical communication with metallization, and wherein said current filament initiator is selected from the group consisting of: optical, e-beam, and self-initiation.

10. A semiconductor current filament light source, comprising:
   a) A substantially planar homogenous semiconductor substrate, having first and second opposing ends wherein said first end is at least partly optically transmissive and light is emitted from said first end;

b) First and second electrical contacts mounted with said substrate near said first and second ends respectively, where said first and second electrical contacts are electrically connected with said substrate, wherein a current flow is generated substantially along the same direction as output light;

c) A current filament initiator, comprising a light beam illuminating said substrate along a path between said first and second ends.

11. A semiconductor current filament light source according to claim 10 wherein said first and second electrical contacts are mounted with a surface of said substrate.

12. A semiconductor current filament light source according to claim 10 wherein said first and second electrical contacts are mounted with opposing edges of said substrate.

13. The light source of claim 10, wherein said semiconductor substrate comprises a material selected from the group consisting of: GaAs, InP, GaSb, GaN, InSb, InN, CdS, CdSe, CdTe, ZnO, ZnS, AlGaAs, InGaAlP, AlGaN, InGaAs, and combinations thereof.

14. A semiconductor current filament light source, comprising:

a) A substantially planar homogenous semiconductor substrate, having first and second opposing surfaces wherein said first surface is at least partly optically transmissive and light is emitted from said first surface;

b) A first electrical contact mounted with said first surface, where said first electrical contact is electrically connected with said substrate;

c) A second electrical contact mounted with said second surface, where said second electrical contact is electrically connected with said substrate;

d) A current filament initiator, comprising a light beam illuminating said subtrate along a path between said first and second surfaces;

e) Wherein a current flow is generated along the same direction as output light.

15. The light source of claim 14, wherein said semiconductor substrate comprises a material selected from the group consisting of: GaAs, InP, GaSb, GaN, InSb, InN, CdS, CdSe, CdTe, ZnO, ZnS, AlGaAs, InGaAlP, AlGaN, InGaAs, and combinations thereof.

* * * * *